United States Patent
Karve et al.

(10) Patent No.: US 9,735,275 B2
(45) Date of Patent: Aug. 15, 2017

(54) CHANNEL REPLACEMENT AND BIMODAL DOPING SCHEME FOR BULK FINFET THRESHOLD VOLTAGE MODULATION WITH REDUCED PERFORMANCE PENALTY

(71) Applicant: International Business Machines Corporation, Armonk, NY (US)

(72) Inventors: Gauri Karve, Cohoes, NY (US); Robert R. Robison, Colchester, VT (US); Reinaldo A. Vega, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/974,537

(22) Filed: Dec. 18, 2015

(65) Prior Publication Data

US 2017/0179274 A1 Jun. 22, 2017

(51) Int. Cl.
| | |
|---|---|
| *H01L 21/8238* | (2006.01) |
| *H01L 21/266* | (2006.01) |
| *H01L 29/78* | (2006.01) |
| *H01L 29/66* | (2006.01) |
| *H01L 29/10* | (2006.01) |

(Continued)

(52) U.S. Cl.
CPC ........ *H01L 29/785* (2013.01); *H01L 21/2253* (2013.01); *H01L 29/1054* (2013.01); *H01L 29/66795* (2013.01); *H01L 21/823431* (2013.01); *H01L 21/823821* (2013.01)

(58) Field of Classification Search
CPC ..... H01L 21/823431; H01L 21/823821; H01L 29/66795; H01L 29/785; H01L 27/0886; H01L 21/823807; H01L 21/823412; H01L 29/66537; H01L 29/1054; H01L 21/2253; H01L 29/105; H01L 29/1083
See application file for complete search history.

(56) References Cited

U.S. PATENT DOCUMENTS

| 6,300,182 B1 | 10/2001 | Yu |
| 7,102,181 B1 * | 9/2006 | Nowak ............. H01L 29/41791 |
| | | 257/250 |
| 7,202,517 B2 | 4/2007 | Dixit et al. |

(Continued)

OTHER PUBLICATIONS

Gauri Karve, et al., "Channel Replacement and Bimodal Doping Scheme for Bulk Finfet Threshold Voltage Modulation With Reduced Performance Penalty", U.S. Appl. No. 15/180,499, filed Jun. 13, 2016.

(Continued)

*Primary Examiner* — Mary Wilczewski
(74) *Attorney, Agent, or Firm* — Cantor Colburn LLP; Vazken Alexanian

(57) ABSTRACT

A method includes removing a top portion of a substrate after implantation of a punch through stopper into the substrate; epitaxially growing undoped material on the substrate, thereby forming a channel; filling a top portion of the channel with an intermediate implant forming a vertically bi-modal dopant distribution, with one doping concentration peak in the top portion of the channel and another doping concentration peak in the punch through stopper; and patterning fins into the channel and the punch though stopper to form a finFET structure.

16 Claims, 12 Drawing Sheets

(51) Int. Cl.
*H01L 21/225* (2006.01)
*H01L 21/8234* (2006.01)

(56) References Cited

U.S. PATENT DOCUMENTS

| | | | |
|---|---|---|---|
| 7,262,104 B1 | 8/2007 | Wang et al. | |
| 7,915,108 B2 | 3/2011 | Jang et al. | |
| 8,298,925 B2* | 10/2012 | Wu | H01L 21/2236 257/408 |
| 8,487,378 B2 | 7/2013 | Goto et al. | |
| 8,859,372 B2* | 10/2014 | Liaw | H01L 29/66795 257/72 |
| 8,932,918 B2 | 1/2015 | Cheng et al. | |
| 8,932,949 B2 | 1/2015 | Cartier et al. | |
| 9,040,399 B2 | 5/2015 | Brodsky et al. | |
| 9,041,158 B2 | 5/2015 | Wann et al. | |
| 9,054,219 B1* | 6/2015 | Hoffmann | H01L 21/823431 |
| 9,082,698 B1* | 7/2015 | Joshi | H01L 29/66795 |
| 9,159,810 B2* | 10/2015 | Tang | H01L 29/785 |
| 9,263,549 B2* | 2/2016 | Rodder | H01L 29/66537 |
| 9,287,264 B1* | 3/2016 | Cheng | H01L 27/0924 |
| 9,306,069 B2* | 4/2016 | Ching | H01L 29/7842 |
| 9,543,215 B2* | 1/2017 | Lim | H01L 21/823821 |
| 9,570,561 B2* | 2/2017 | Hsiao | H01L 29/36 |
| 2007/0155075 A1* | 7/2007 | Kim | H01L 21/823412 438/197 |
| 2010/0038679 A1* | 2/2010 | Chan | H01L 29/66795 257/190 |
| 2011/0127610 A1* | 6/2011 | Lee | H01L 21/823431 257/365 |
| 2011/0309333 A1* | 12/2011 | Cheng | B82Y 10/00 257/24 |
| 2012/0112248 A1* | 5/2012 | Wu | H01L 21/2236 257/255 |
| 2013/0105914 A1* | 5/2013 | Lin | H01L 29/7851 257/402 |
| 2013/0134485 A1* | 5/2013 | Fumitake | H01L 29/808 257/287 |
| 2013/0252349 A1* | 9/2013 | Pradhan | H01L 21/26513 438/4 |
| 2013/0334605 A1* | 12/2013 | Wu | H01L 21/2236 257/365 |
| 2014/0054679 A1* | 2/2014 | Tang | H01L 29/785 257/329 |
| 2014/0227846 A1* | 8/2014 | Liaw | H01L 29/66795 438/283 |
| 2014/0312393 A1* | 10/2014 | Rodder | H01L 29/66537 257/288 |
| 2015/0001591 A1* | 1/2015 | Akarvardar | H01L 29/785 257/288 |
| 2015/0041923 A1* | 2/2015 | Lu | H01L 21/2652 257/401 |
| 2015/0069474 A1* | 3/2015 | Ching | H01L 29/7842 257/288 |
| 2015/0255456 A1* | 9/2015 | Jacob | H01L 27/0886 257/401 |
| 2015/0311123 A1* | 10/2015 | Zhu | H01L 21/8238 257/401 |
| 2015/0340292 A1* | 11/2015 | Dong | H01L 21/823821 438/199 |
| 2016/0049402 A1* | 2/2016 | Liu | H01L 27/0924 257/369 |
| 2016/0056269 A1* | 2/2016 | Lee | H01L 29/66795 438/424 |
| 2016/0093619 A1* | 3/2016 | Cheng | H01L 27/0924 257/369 |
| 2016/0172470 A1* | 6/2016 | Ching | H01L 29/7842 438/429 |
| 2016/0190137 A1* | 6/2016 | Tsai | H01L 27/0924 257/369 |
| 2016/0218104 A1* | 7/2016 | Wen | H01L 21/845 |
| 2016/0322358 A1* | 11/2016 | Ching | H01L 27/0924 |
| 2017/0005002 A1* | 1/2017 | Ching | H01L 21/823412 |
| 2017/0047425 A1* | 2/2017 | Bentley | H01L 29/66537 |

OTHER PUBLICATIONS

List of IBM Patents or Patent Applications Treated as Related; (Appendix P), Filed Jun. 13, 2016, 2 pages.

Witters et al., "Strained Germanium Quantum Well PMos FinFets Fabricated on in situ Phosphorus-Doped SiGe Strain Relaxed Buffer Layers Using a Replacement Fin Process", IEDM13-536, 4pgs.

* cited by examiner

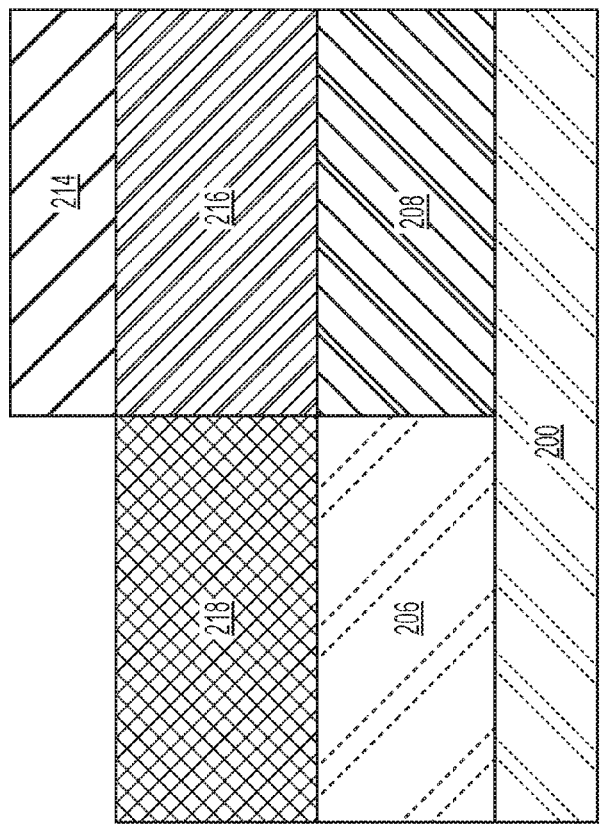
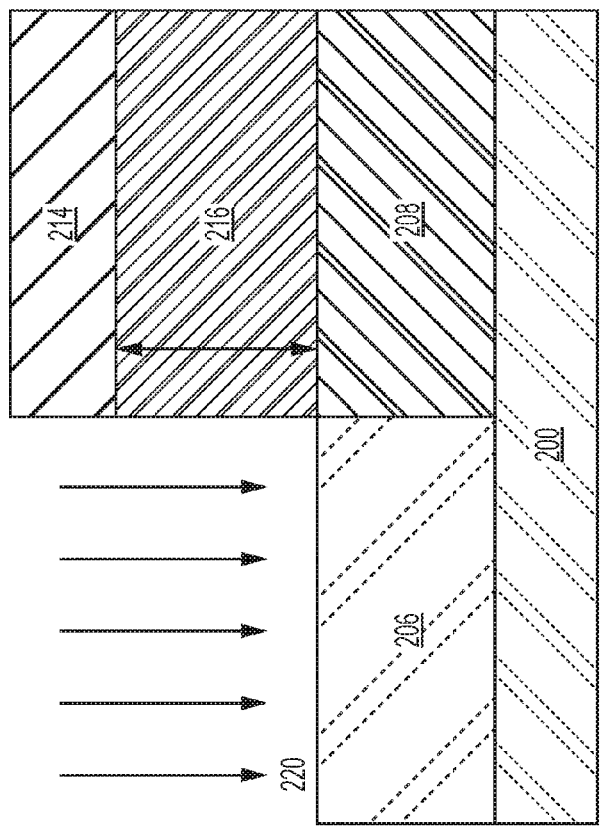
FIG. 3A
FIG. 3B

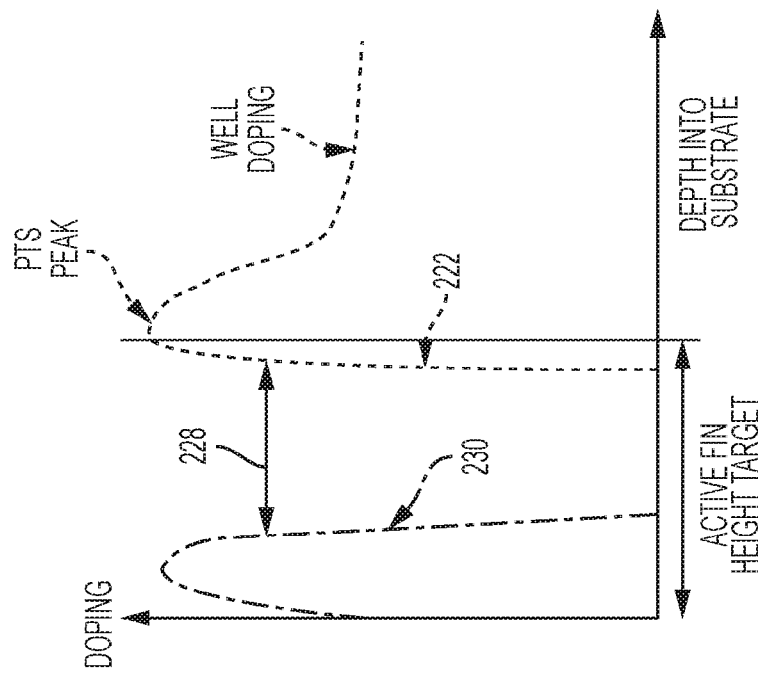
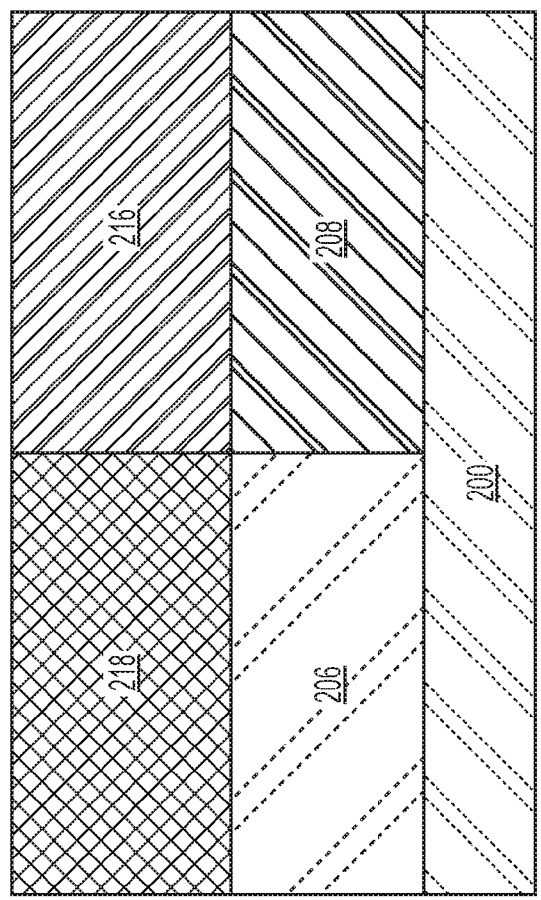

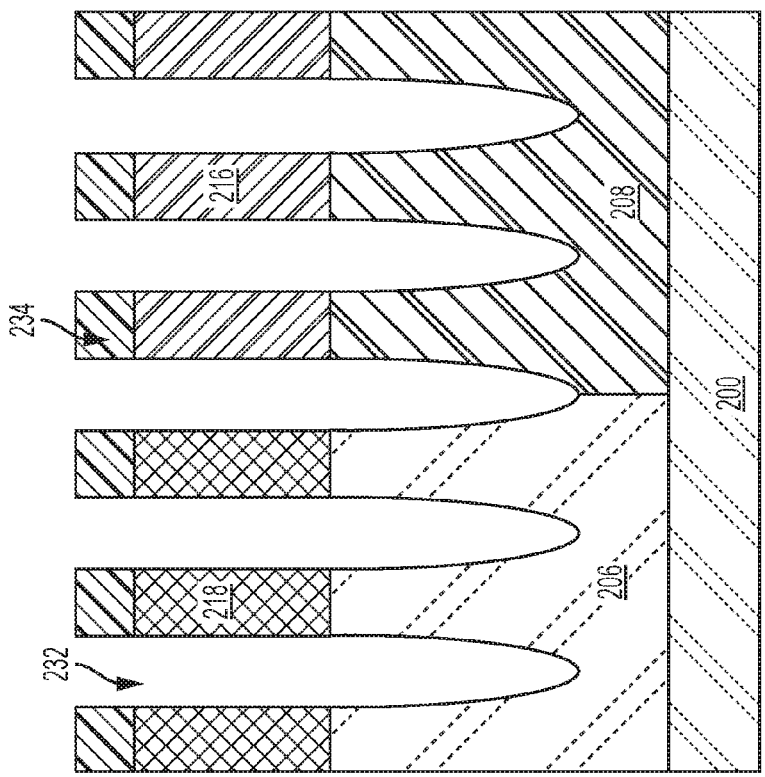
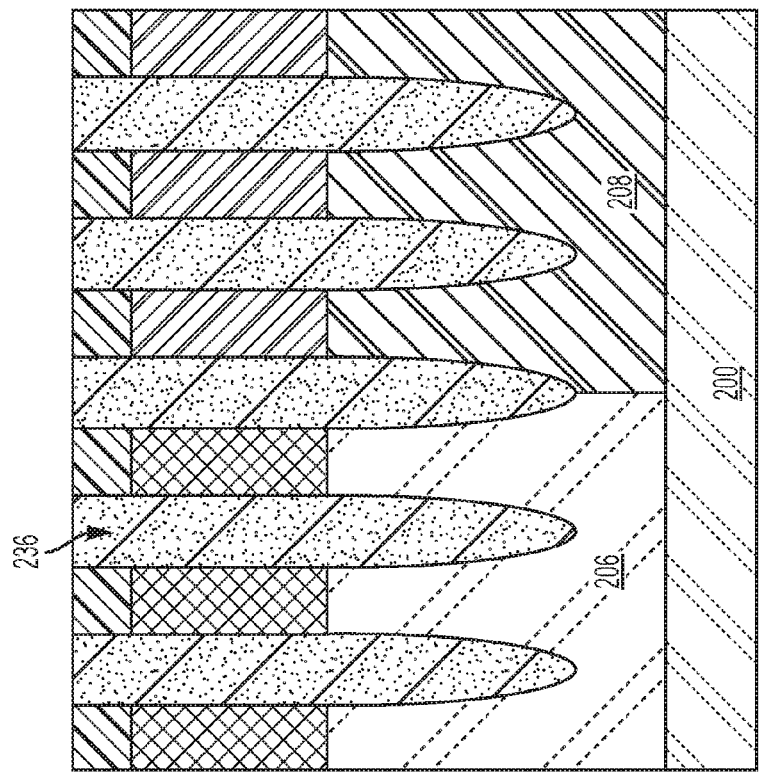
FIG. 7B
FIG. 7A

CHANNEL REPLACEMENT AND BIMODAL DOPING SCHEME FOR BULK FINFET THRESHOLD VOLTAGE MODULATION WITH REDUCED PERFORMANCE PENALTY

BACKGROUND

The present disclosure relates to the field of semiconductor fabrication, and more specifically, to threshold voltage tuning for fin field effect transistors (finFET) on a substrate while reducing performance penalties due to the tuning.

Integrated circuits (ICs) can include large numbers of devices on a single substrate. As the number of devices formed per IC substrate and the density of the devices on the substrate increases, the dimensions of the individual devices drops significantly. In particular, the dimensions of gate thickness and channel separation of source and drain elements of field effect transistor (FET) devices may be reduced such that there are only micrometer and nanometer separations of the source, drain, and gate in the substrate. Although devices are being steadily reduced in size, the performance characteristics of the devices must be maintained or improved. In addition to performance characteristics, performance reliability, and durability of devices, manufacturing reliability and cost are also critical.

Several problems can arise with the miniaturization of devices, including short channel effects, punch-through, and current leakage. These problems affect both the performance of the devices and the manufacturing process. The impact of short channel effects on device performance is seen in a reduction in the device threshold voltage and an increase of sub-threshold current. More particularly, as the channel length becomes smaller, the source and drain depletion regions get closer to each other. The depletion regions may essentially occupy the entire channel area between the source and drain. As a result of this effective occupation of the channel area by the source and drain depletion regions, the channel is in part depleted and the gate charge necessary to alter the source and drain current flow is reduced.

A finFET is a type of field effect transistor structure that exhibits reduced short channel effects. In a finFET structure, the channel is formed as a vertical silicon fin structure on top of a substrate, with the gate also being located in the fin structure on top of the channel. A finFET may be formed on an undoped or low-doped substrate. FinFETs can have superior carrier mobility, due to lowered effective field (Eeff) and reduced carrier scattering. A finFET structure may also alleviate random dopant fluctuation (RDF) at relatively small devices dimensions as compared to a standard FET.

Depending on the application for which an IC chip is used, finFETs having different threshold voltages (Vt) may need to be present in the IC. However, variation of the threshold voltages across a large number of finFETs on a single substrate may present difficulties. The threshold voltage may be modulated by tuning the finFET gate stack work functions, but gate stack patterning to tune the work functions in gate-first finFET fabrication is challenging, and the choice of gate metals that results in different work functions that may be used in gate-last processing is relatively limited. Furthermore, carrier mobility, effective channel length and overlap capacitance can be adversely affected.

SUMMARY

According to an embodiment, a method includes removing a top portion of a substrate after implantation of a punch through stopper into the substrate; epitaxially growing undoped material on the substrate, thereby forming a channel; filling a top portion of the channel with an intermediate implant forming a vertically bi-modal dopant distribution, with one doping concentration peak in the top portion of the channel and another doping concentration peak in the punch through stopper; and patterning fins into the channel and the punch though stopper to form a finFET structure.

According to an embodiment, a finFET structure includes a punch through stopper disposed between an active fin and a substrate; a channel region formed in the active fin to the punch through stopper; a channel implant disposed in a top portion of the channel; and a vertically bi-modal dopant distribution.

According to another embodiment, a finFET structure includes a punch through stopper disposed between an active fin and a substrate; a channel region located in the active fin through to a portion of the punch through stopper; a channel implant disposed in a top portion of the channel; and a vertically bi-modal dopant distribution.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 3A is a cross-section illustration of the structure of FIG. 1 with patterned removal of a PFET channel region.

FIG. 3B is a cross-sectional illustration of the structure of FIG. 1 with patterned replacement of a PFET channel region.

FIG. 6A is a cross-sectional illustration of the structure of FIG. 1 after the shallow implants and post implant annealing.

FIG. 6B is a representation of the doping gap present after shallow implantation and annealing.

FIG. 7A is a cross-sectional illustration of fin patterning the structure of FIG. 1.

FIG. 7B is a cross-sectional illustration of the fin patterning the structure of FIG. 1.

DETAILED DESCRIPTION

Figure 1:
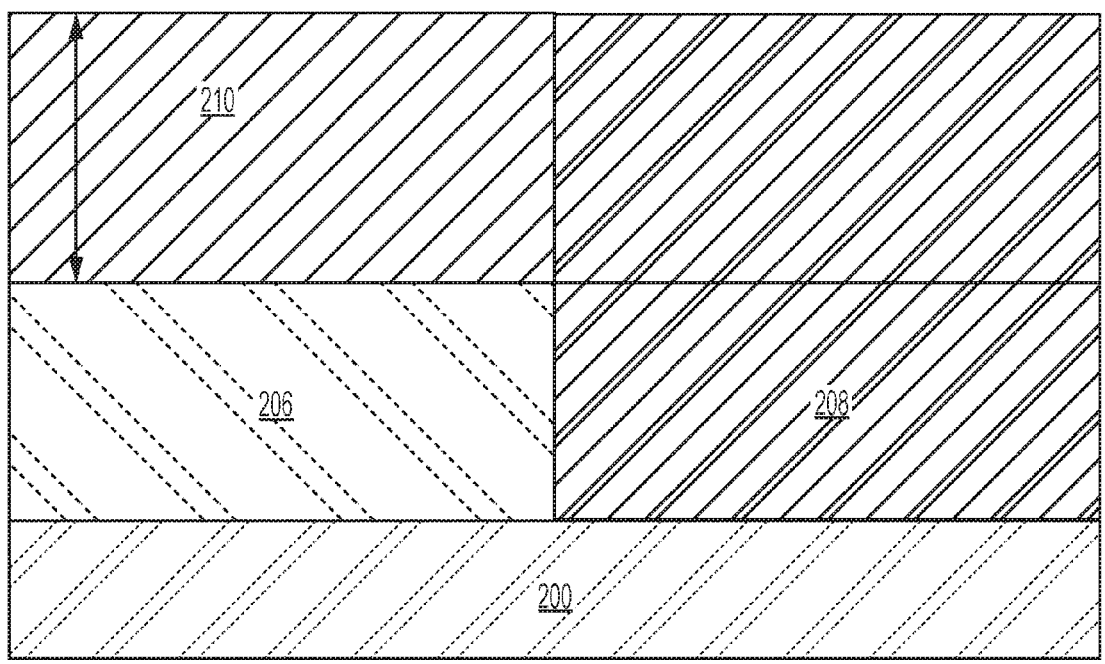
FIG. 1 is a cross-sectional illustration of a structure before active fins are formed.

Generally, a complementary metal oxide semiconductor (CMOS) can include more threshold voltages than can be covered by gate work function alone. The additional threshold voltages can be reached by a supplementary means, for example, doping of the fin. However, adjusting the threshold voltage of a finFET structure by doping can degrade mobility and overlap capacitance (Coy) and therefore effective drive current (Ieff). In a bulk finFET, the majority of fin doping exists towards a bottom of the fin. This means that the source/drain junction profile toward bottom of the fin is further away from the channel than toward the top of the fin. Thus, Cov at the fin bottom is lower than at the fin top. By adding more doping toward the fin bottom to adjust the threshold voltage, Cov at the fin bottom drops further while Cov at the fin top is largely unchanged. This further degrades current conduction toward the fin bottom, resulting in a significant degradation of Ieff.

Doping can be accomplished with a punch through stopper implant, generally performed before the fin patterning etch. The punch through stopper has an implant peak toward the bottom of the active fin (e.g., the bottom portion of the fin where the gate electrode can electrostatically couple to), and an implant tail that extends upward and downward, away from the peak. The portion of the tail extending upward into the active fin dopes the fin and modulates the threshold voltage. Such a dopant distribution is non-uniform about its fin height. Stated another way, adding doping near the top of the fin can mean adding more doping toward the bottom of the fin (i.e., increasing the punch through stopper implant dose) and having it diffuse upwards, which results in the top of the fin never contributing much to threshold voltage modulation as compared to the bottom of the fin. At the same time, the bottom of the fin, since it is so heavily doped, can exhibit high junction leakage. Having high doping toward the bottom of the fin for meaningful threshold voltage shifts can result in a corresponding mobility penalty and overlap capacitance reduction in this region, thereby resulting in a corresponding mobility penalty relative to achieving the same threshold voltage by gate work function. Disclosed herein is a method of tuning threshold voltage by fin doping, but resulting in a lower effective drive current penalty and a lower overlap capacitance penalty simultaneously at the equivalent threshold voltage shift as other fin doping methods.

In the method and systems disclosed herein, a top portion of a substrate (e.g., a bulk substrate) can be removed after the punch through stopper is implanted. A removal depth of the top portion of the substrate can be equivalent to the punch through stopper peak doping. Epitaxial growth of undoped substrate material can then occur. The undoped substrate material can be the same as or different from the underlying substrate. This removes the tail of the punch through stopper that would otherwise extend up and into the active fin and degrade mobility, while retaining the punch through stopper profile beneath the active fin, which can suppress sub-fin leakage. Next, a shallow intermediate implant can be performed, which can introduce dopants toward the top of the substrate, after which the fin patterning etch can be performed. This leaves a doping gap between the punch through stopper peak (at the fin bottom) and the intermediate implant profile (toward the fin top). The doping gap can assist in channel mobility, while the bimodal doping distribution can improve doping and overlap capacitance uniformity across the fin height. This can allow the top of the fin to contribute more to the threshold voltage modulation and can result in higher effective drive current at the same doping induced threshold voltage shift as compared to another punch through stopper implantation scheme without the doping gap.

With reference to FIGS. 1-8, a method for pattering fins as described herein is disclosed. As shown in FIG. 1, a substrate 200 as previously described herein can be implanted with a Nwell and a P field effect transistor (PFET) punch through stopper layer 206 (also referred to herein as a PFET sub-fin region) and a Pwell and a NFET punch through stopper layer 208 (also referred to herein as a NFET sub-fin region). The active fin height target 210 is also shown in FIG. 1.

Figure 2A:
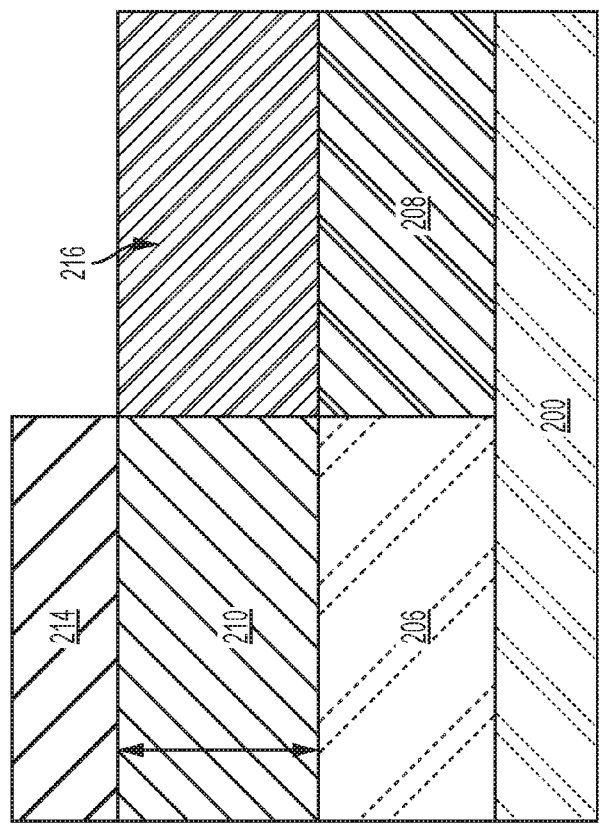
FIG. 2A is a cross-section illustration of the structure of FIG. 1 with patterned removal of a NFET channel region.
Figure 2B:
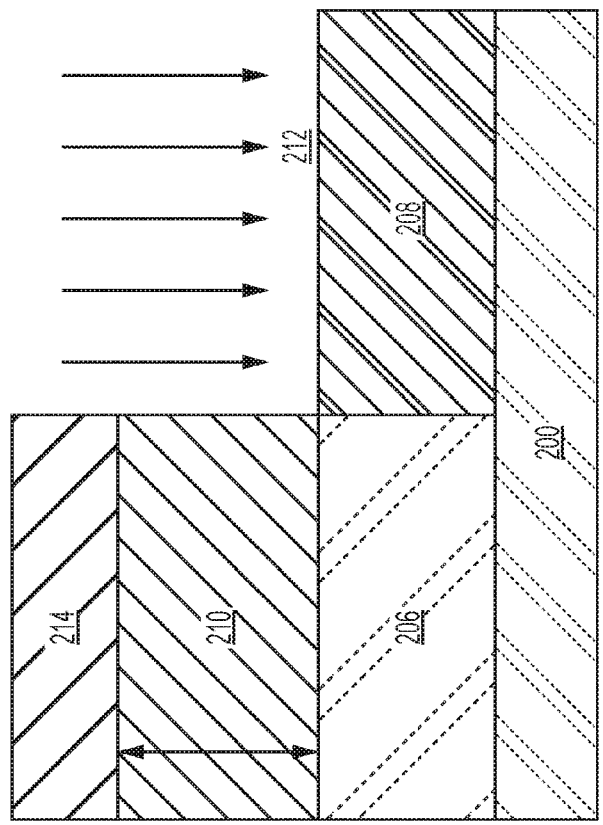
FIG. 2B is a cross-sectional illustration of the structure of FIG. 1 with patterned replacement of a NFET channel region.

Next, a channel region can be patterned and removed as demonstrated in FIGS. 2A and 2B. Either the NFET or PFET channel region can be removed first. In this illustrative, non-limiting embodiment, an NFET first scheme is shown. As seen in FIGS. 2A and 2B, an NFET channel 216 can be etched down to the punch through stopper peak 212 with a hardmask 214 disposed over the PFET sub-fin region 206. The NFET channel 216 can then be grown as shown in FIG. 2B with undoped epitaxy. The process is then repeated for a PFET channel 218 where a PFET channel 218 can be etched down to the punch stopper peak 220 in FIG. 3A. The PFET channel 218 can then be grown as shown in FIG. 3B with undoped epitaxy. The regrown channel 216, 218 can each, independently, comprise a material that is the same as or different from the underlying substrate 200. The regrown channels 216, 218 can each comprise a multi-stack layer (e.g., graded SiGe, Si/SiGe/Si/SiGe heteroepitaxial stack, graded III-V, etc.) or otherwise a material that is different from the sub-fin regions 206, 208 and/or the substrate 200.

Figure 4B:
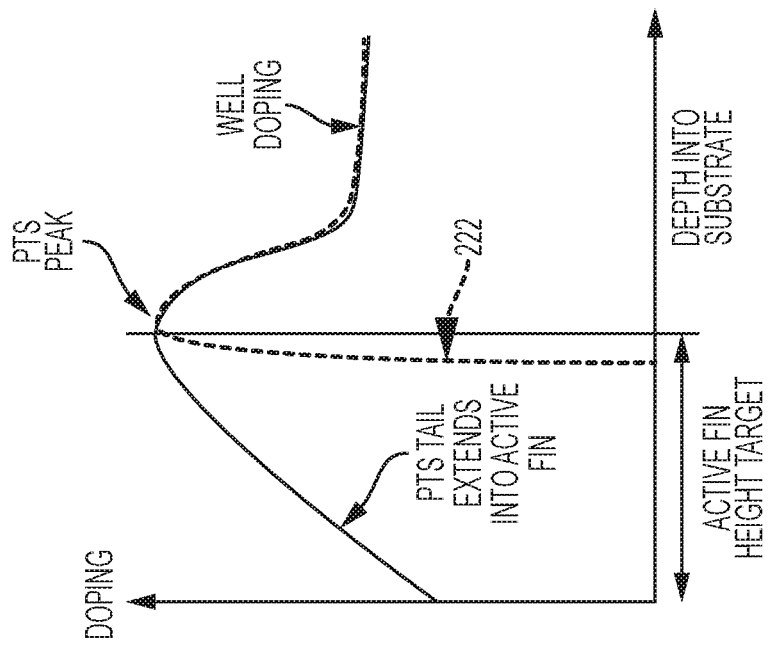
FIG. 4B is a cross-sectional illustration of the amount of doping, active fin height target, and depth into the substrate.
Figure 4A:
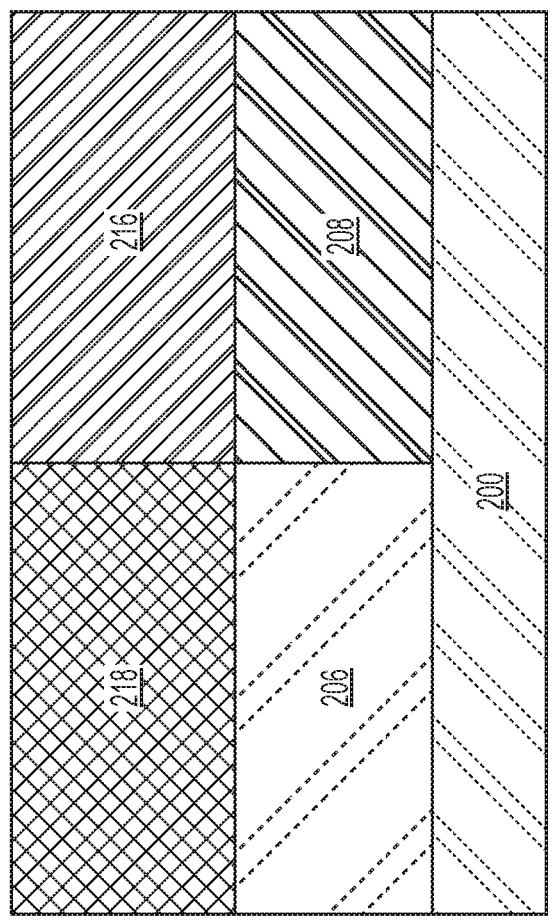
FIG. 4A is a cross-sectional illustration of the structure of FIG. 1 after epitaxial growth.
Figure 5A:
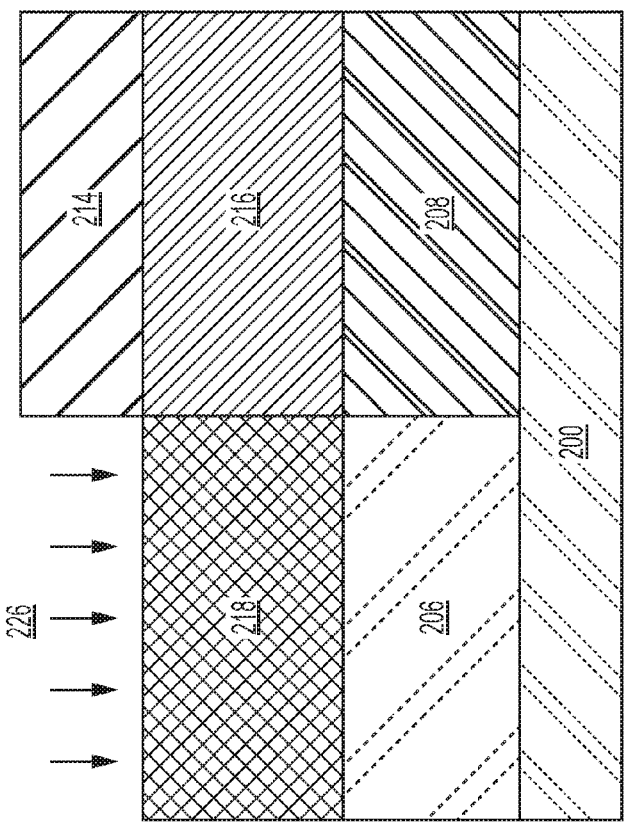
FIG. 5A is a cross-sectional illustration of the structure of FIG. 1 with shallow p-type implants.
Figure 5B:
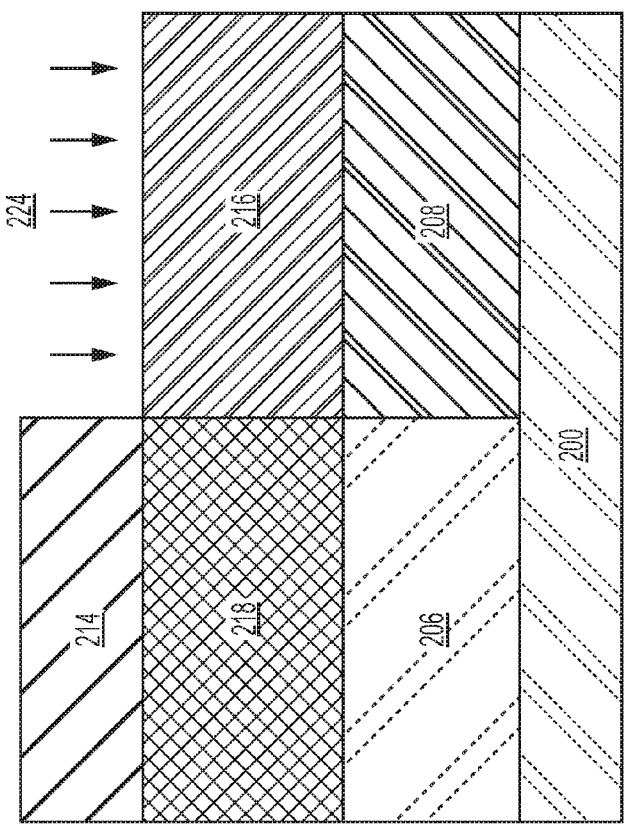
FIG. 5B is a cross-sectional illustration of the structure of FIG. 1 with shallow n-type implants.

FIG. 4A shows the structure after epitaxy growth where an NFET channel 216 and a PFET channel 218 are both present. In FIG. 4A, both the NFET channel 216 and the PFET channel 218 are undoped due to etching away of the original channel material that had the punch through stopper tail extending into it (see FIG. 4B) and replacement with an undoped epitaxial channel. As can be seen in FIG. 4B, the profile for the structure disclosed herein 222 has an abrupt punch through stopper tail with diffusion limited since most of the fin is undoped at that point. Turning now to FIGS. 5A and 5B, intermediate shallow implants are performed. A shallow type p-implant 224 implanted over the NFET channel 216 in FIG. 5A and a shallow type n-implant 226 is implanted over the PFET channel 218 in FIG. 5B. These intermediate implants are designed to fill a top portion of the channel material, but not extend all the way to the punch through stopper, leaving an undoped or low-doped gap between the top implant profile and the bottom punch through stopper profile. These shallow intermediate implants can function to adjust the threshold voltage while minimizing drive current penalties.

FIG. 6A shows the structure after implantation of the shallow implants and post-implant annealing. FIG. 6B shows the bimodal doping structure with doping gap 228 located between the shallow implant 230 and the abrupt punch through stopper tail 222 located at the bottom of the fin.

Figure 8:
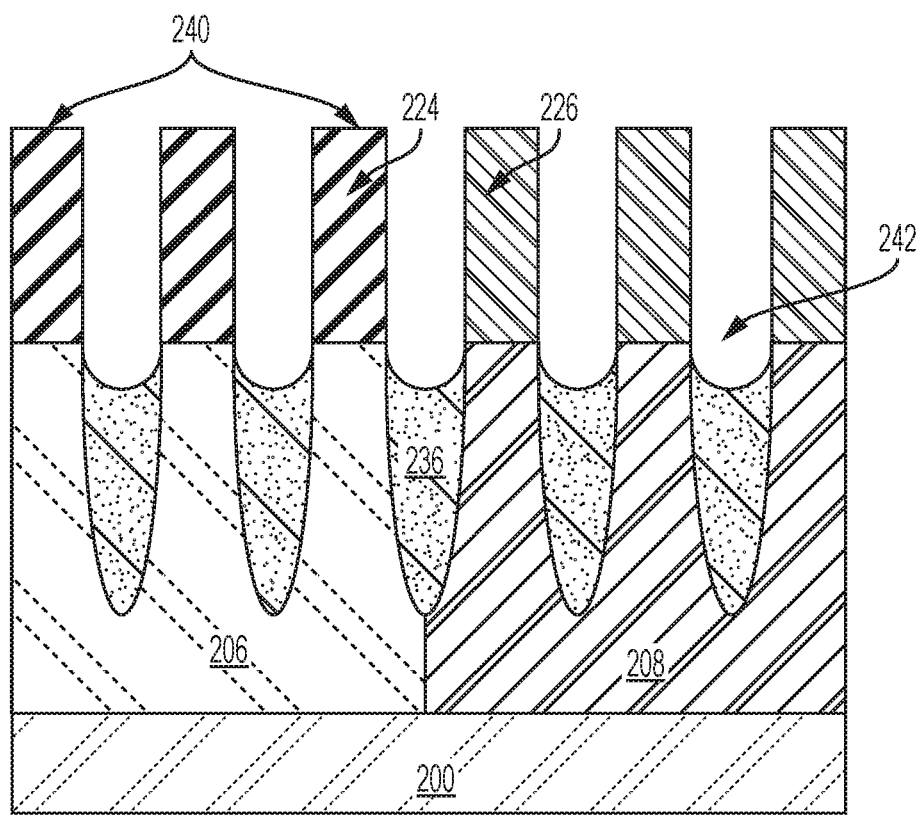
FIG. 8 is a cross-sectional illustration of a fin reveal etch and hardmask removal.

FIGS. 7A and 7B show the structure after fin patterning where reactive ion etching 232 is performed to form fins in a portion of the PFET channel 218, PFET sub-fin region 206, NFET channel 216, and NFET sub-fin region 208. A fin reaction ion etching hard mask 234 can be disposed over a portion of each of these before reactive ion etching 232 is performed. A local trench oxide 236 can be used to fill before chemical mechanical planarization is conducted as shown in FIG. 7B. The hard mask can include silicon, nitride, or a combination comprising at least one of the foregoing. In FIG. 8, the fin reveal etch and hardmask removal are shown. Revealed active fins 240 are shown along with the fin depth 242 down to the punch through stopper peaks 212, 220.

From this structure, processing can be performed to form the gate stack, sidewall spacers, source/drain regions, contact regions, etc.

Figure 9:
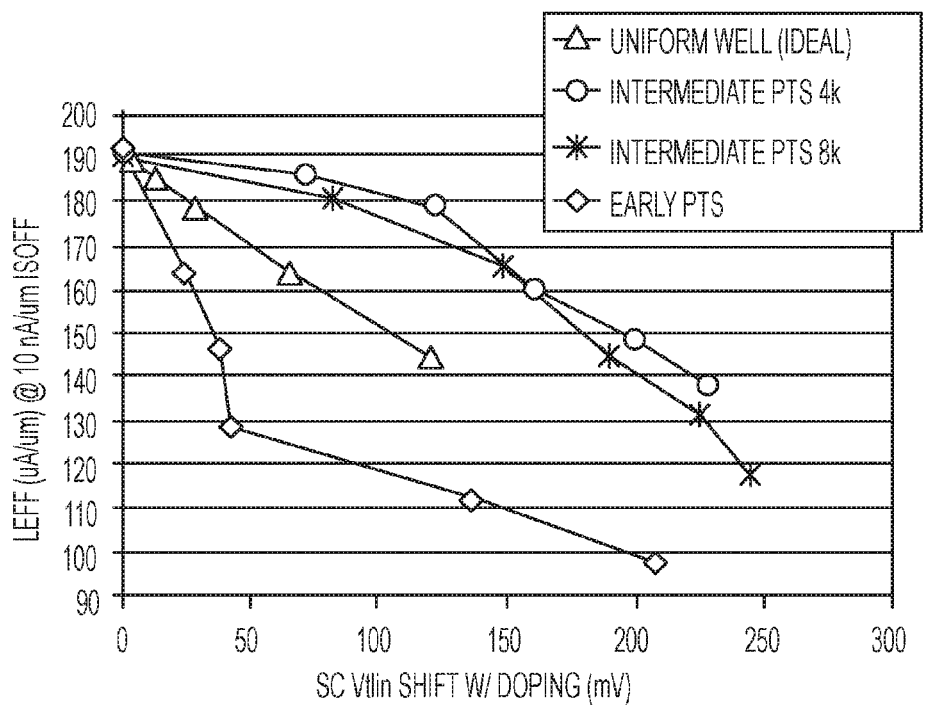
FIG. 9 is a graphical illustration of the effective drive current versus threshold voltage shift.
Figure 10:
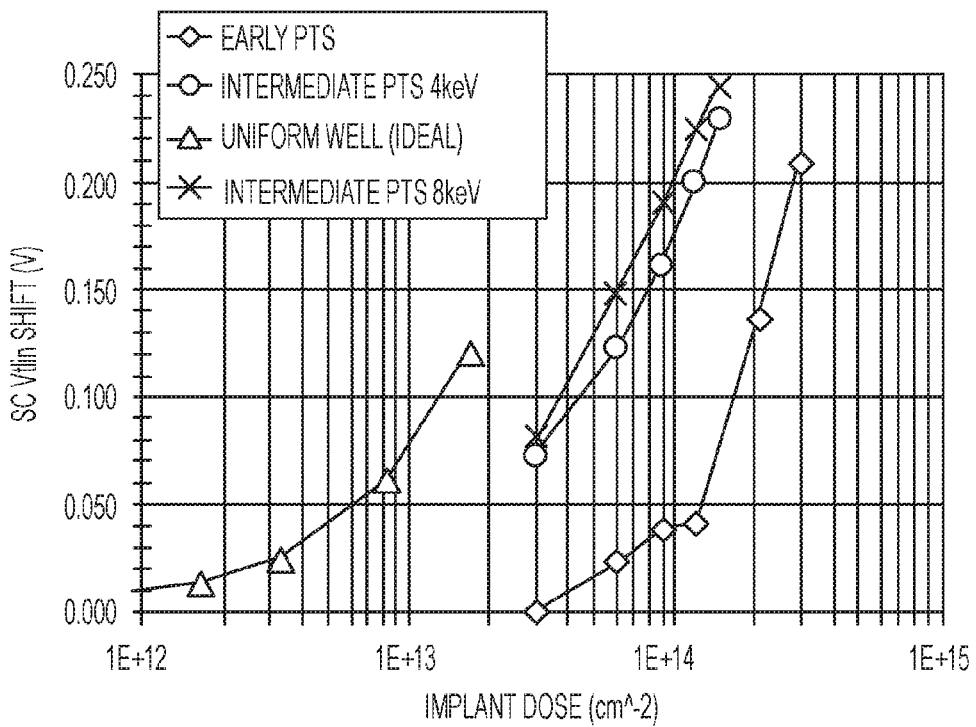
FIG. 10 is a graphical illustration of the threshold voltage shift versus the implant dose.
Figure 11:
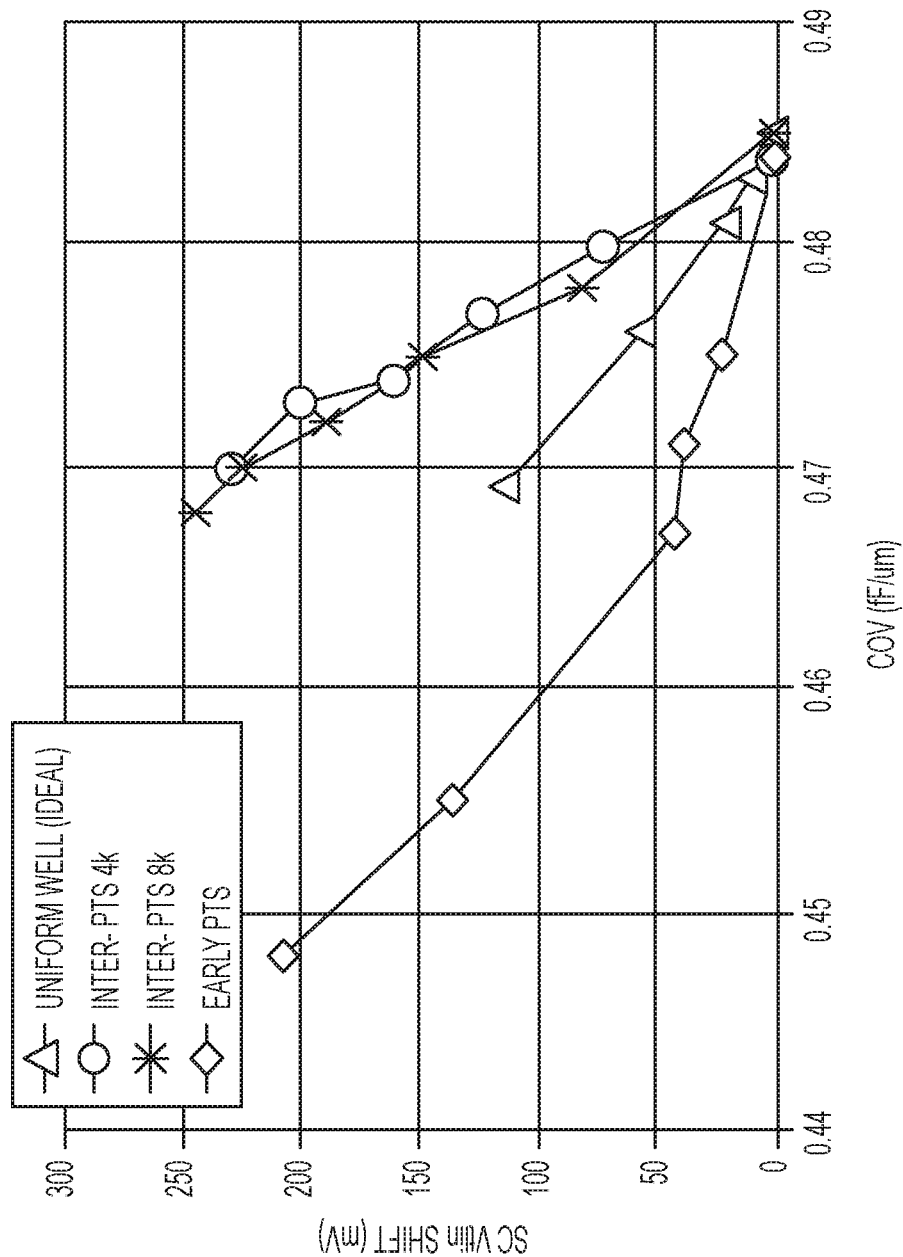
FIG. 11 is a graphical illustration of the threshold voltage shift versus the overlap capacitance.

FIG. 9 is a graphical illustration of the effective drive current versus threshold voltage shift, where effective drive current is measured in microamperes per micron of total channel width, referenced at an off-state leakage current of 10 nanoamperes per micron, and threshold voltage shift with doping measured in millivolts (mV). FIG. 10 is a graphical illustration of the threshold voltage shift versus the implant dose, where threshold voltage shift was measured in Volts (V) and implant dose measured in inverse square centimeters ($1/cm^2$). FIG. 11 is a graphical illustration of the threshold voltage shift versus the overlap capacitance, where threshold voltage shift is measured in mV and overlap capacitance measured in femtofarads per micron of total channel width. As can be seen, the early punch through stopper requires a high implant dose and cuts off bottom access to the channel, in addition to mobility degradation toward the fin bottom, resulting in a significant effective drive current degradation compared to the intermediate punch through stopper cases, for the same threshold voltage shift. Intermediate punch through stopper has the highest performance across the full range of threshold voltage shifts.

Figure 12:
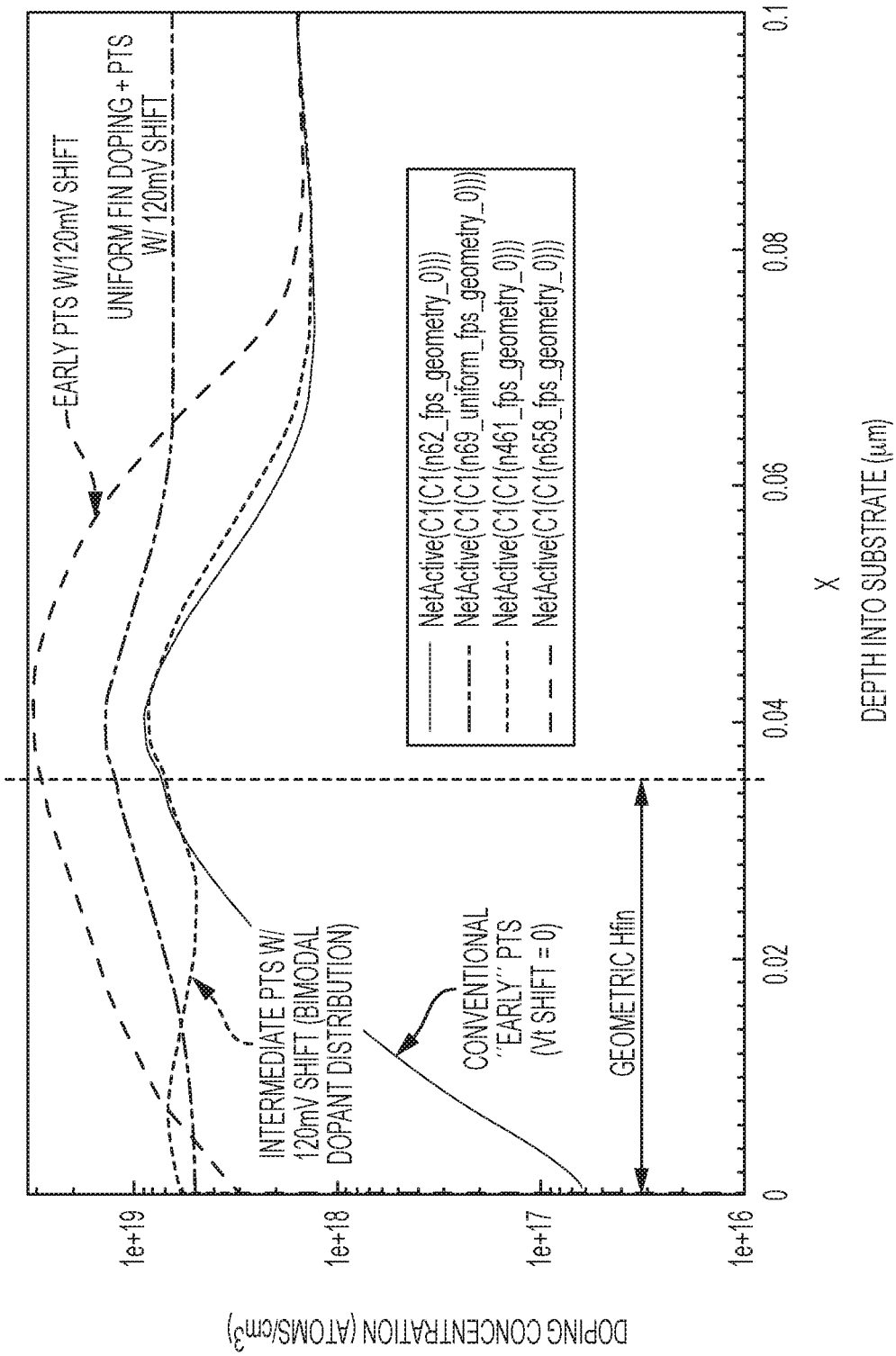
FIG. 12 is a graphical illustration of the doping profile in the fin for a 120 millivolt threshold voltage shift.

FIG. 12 is a graphical illustration of the doping profile in the fin for a 120 millivolt threshold voltage shift, where doping concentration, measured in atoms per cubic centimeter (atoms/$cm^3$), is plotted against depth into the substrate measured in micrometers (μm). The intermediate punch through stopper case has a higher doping at the fin top and a lower doping at the fin bottom than any of the other cases at the same threshold voltage shift. This results in the top of the fin contributing more to threshold voltage modulation than the other cases. Also shown here is a bi-modal dopant distribution in the intermediate punch through stopper implant case (one dopant peak toward the fin top and another dopant peak toward the fin bottom).

Figure 13:
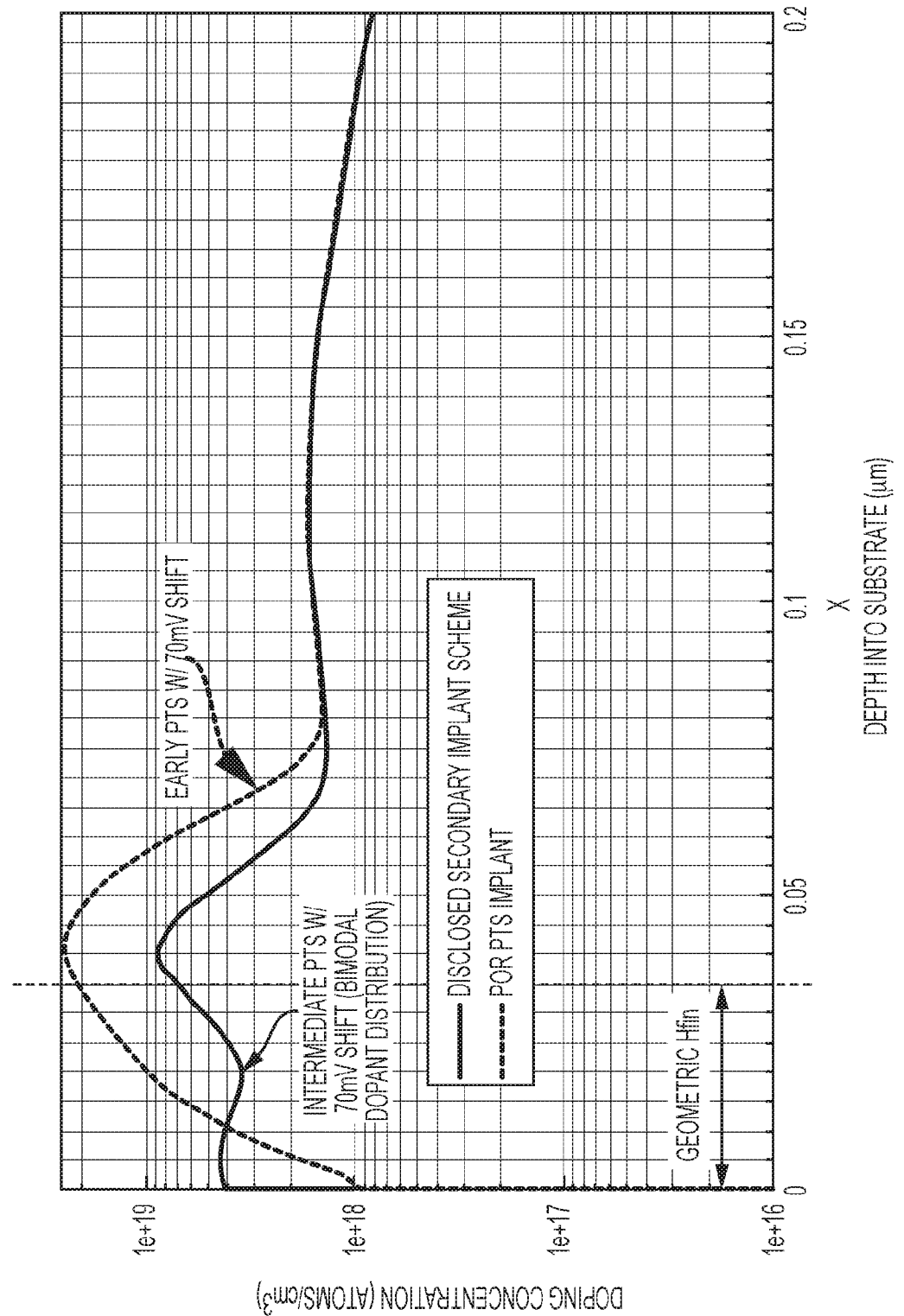
FIG. 13 is a graphical illustration of the doping profile in the fin for a 70 millivolt threshold voltage shift.

FIG. 13 is a graphical illustration of the doping profile in the fin for a 70 millivolt threshold voltage shift where doping concentration measured in atoms per cubic centimeter (atoms/$cm^3$) is plotted again depth into the substrate measured in micrometers (μm). Again, the intermediate punch through stopper case has a higher doping at the fin top and a lower doping at the fin bottom than any of the other cases at the same threshold voltage shift, resulting in the same trend as shown in FIG. 13 and the same type of bi-modal dopant distribution.

With the method and system disclosed herein, shallow post epitaxy implant into the top portion of the channel (NFET or PFET) can place the dopants where they are of greatest effect for threshold voltage modulation while minimizing mobility and overlap capacitance penalties toward the bottom of the fin. A lower implant dose can be used to achieve the same threshold voltage shift, which means less implant damage and less random dopant fluctuation. Channel replacement eliminates the punch through stopper tail, which would otherwise extend into the fin, from the bottom toward the top, and replaces this with undoped epitaxy, resulting in higher mobility. The punch through stopper profile of the method and system disclosed herein can extend up into the active channel and is abrupt, with little upward diffusion into the channel. A secondary dopant peak exists toward the top of the fin, resulting in a bimodal dopant distribution (i.e., one at the top and one at the bottom). Moreover, the channel replacement disclosed herein can enable introduction of channel materials different from the substrate material.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   removing a top portion of a substrate after implantation of a punch through stopper into the substrate;
   epitaxially growing undoped material on the substrate, thereby forming a channel;
   filling a top portion of the channel with an intermediate implant forming a vertically bi-modal dopant distribution, with one doping concentration peak in the top portion of the channel and another doping concentration peak in the punch through stopper; and
   patterning fins into the channel and the punch though stopper to form a finFET structure;
   wherein a doping gap is formed between the doping concentration peak of the punch through stopper and the doping concentration peak in the top portion of the channel.

2. The method of claim 1, further comprising etching a portion of the substrate down to a peak of the punch through stopper.

3. The method of claim 1, wherein the intermediate implant comprises a p-type implant.

4. The method of claim 1, wherein the intermediate implant comprises an n-type implant.

5. The method of claim 1, wherein the intermediate implant assists in adjusting the threshold voltage of the finFET structure.

6. The method of claim 1, wherein the finFET structure has a larger effective drive current for the same doping induced threshold voltage shift as compared to a finFET structure without the bi-modal dopant distribution.

7. The method of claim 1, wherein removing a top portion of the substrate also removes a top portion of a tail of the punch through stopper extending from the peak of the punch through stopper toward the top of the substrate.

8. The method of claim 1, wherein the channel material comprises a multi-layer stack comprising SiC, SiGe, a repeating Si/SiGe heteroepitaxial stack, a repeating III-V heteroepitaxial stack, graded III-V, or a combination comprising at least one of the foregoing.

9. The method of claim 1, wherein the fins are patterned by reactive ion etching.

10. The method of claim 1, wherein the finned channel regions have a dopant peak toward a top of the fin or wherein the finned channel regions have a dopant peak toward a bottom of the fin.

11. The method of claim 1, wherein a secondary dopant peak is present at a top of the fin.

12. The method of claim 1, wherein the punch through stopper is disposed between an active fin and the substrate, wherein the active fin has a higher doping at a top of the active fin as compared to a bottom of the active fin.

13. The method of claim 1, wherein the punch through stopper has higher doping at the fin top and lower doping at the fin bottom.

14. The method of claim 1, wherein the doping gap increases channel mobility.

15. The method of claim 1, wherein the doping gap allows the top of the fin to contribute more to threshold voltage modulation.

16. The method of claim 1, wherein the dopant gap results in higher effective drive current at the same doping induced threshold voltage shift as compared to another punch through stopper implantation scheme without the doping gap.

* * * * *